United States Patent [19]
Takashima

[11] Patent Number: 5,267,212
[45] Date of Patent: Nov. 30, 1993

[54] RANDOM ACCESS MEMORY WITH RAPID TEST PATTERN WRITING

[75] Inventor: Sumihiuro Takashima, Tokyo, Japan

[73] Assignee: Oki Electric Industry Co., Ltd., Tokyo, Japan

[21] Appl. No.: 777,594

[22] Filed: Oct. 16, 1991

[30] Foreign Application Priority Data

Oct. 25, 1990 [JP] Japan .................. 2-284578

[51] Int. Cl.⁵ .................................. G11C 11/40
[52] U.S. Cl. ................... 365/201; 365/230.06; 371/21.3
[58] Field of Search ............ 365/230.04, 230.06, 365/230.02, 230.01, 231, 201, 200; 371/21.3, 21.2

[56] References Cited

U.S. PATENT DOCUMENTS

| | | | |
|---|---|---|---|
| 4,047,163 | 9/1977 | Choate et al. | 365/201 |
| 4,543,647 | 9/1985 | Yoshida | 365/201 |
| 4,689,772 | 8/1987 | Jordy et al. | 365/201 |
| 4,899,307 | 2/1990 | Lenoski | 365/231 |
| 4,920,515 | 4/1990 | Obata | 365/201 |
| 5,025,422 | 6/1991 | Moriwaki et al. | 365/201 |

FOREIGN PATENT DOCUMENTS 52300 2/1989 Japan .

*Primary Examiner*—Eugene R. LaRoche
*Assistant Examiner*—Vu Le
*Attorney, Agent, or Firm*—Spencer, Frank & Schneider

[57] ABSTRACT

A row address decoder generates row select signals and a column address decoder generates column select signals. A first group of logic gates combines the even-numbered column select signals with a first group select signal. A second group of logic gates combines the odd-numbered column select signals with a second group select signal. A third group of logic gates combines the even-numbered row select signals with a third group select signal. A fourth group of logic gates combines the odd-numbered row select signals with a fourth group select signal. Outputs of these logic gates select rows and columns in a memory cell array.

27 Claims, 2 Drawing Sheets

RANDOM ACCESS MEMORY WITH RAPID TEST PATTERN WRITING

BACKGROUND OF THE INVENTION

The ubiquitous random access memory enables direct read or write access to data at an arbitrarily specified address, but allows only one address to be accessed at a time. Writing test patterns in such a memory is a lengthy process, because it is necessary to write to every address individually. Long test times add to the manufacturing cost of the memory.

Random access memories are generally initialized by a software routine that writes initial data at each address successively, but this also takes time. The result is the annoying delay experienced, for example, when a personal computer is switched on.

SUMMARY OF THE INVENTION

It is accordingly an object of the present invention to write test patterns in a random access memory quickly.

Another object of the invention is to initialize a random access memory quickly.

A further object of the invention is to initialize a random access memory without using software.

The invented random access memory has a memory cell array comprising rows and columns of memory cells. A row address decoder with an output terminal for each row decodes a row address and produces an active row select signal at the output terminal for the addressed row. A column address decoder with an output terminal for each column decodes a column address and produces an active column select signal at the output terminal for the addressed column.

A first plurality of logic gates combines each of the even-numbered column select signals with a first group select signal. A second plurality of logic gates combines each of the odd-numbered column select signals with a second group select signal. A third plurality of logic gates combines each of the even-numbered row select signals with a third group select signal. A fourth plurality of logic gates combines each of the odd-numbered row select signals with a fourth group select signal. Outputs of these logic gates select rows and columns in the memory cell array.

DETAILED DESCRIPTION OF THE INVENTION

A more detailed description will be given with reference to the drawings, which illustrate one embodiment of the invention. For simplicity, this embodiment is a static random access memory (SRAM) with a storage capacity of 256 one-bit words. The invention is of course not limited to this memory, but is applicable to other random access memories as well.

Figure 1:
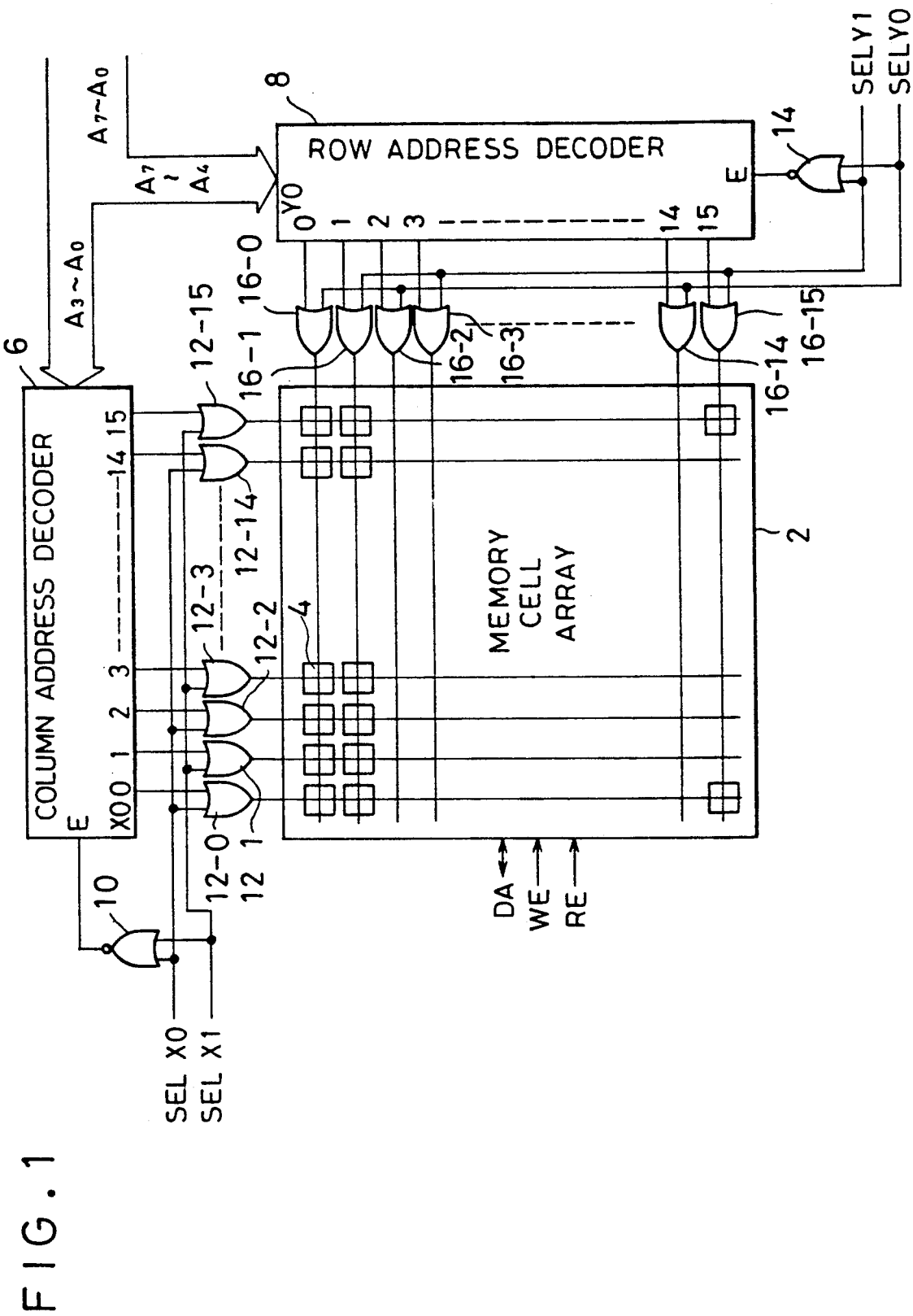
FIG. 1 is a block diagram of the invented random access memory.
Figure 4:
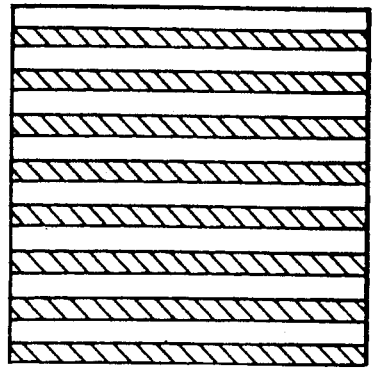
FIG. 4 illustrates a vertical-stripe test pattern.

Referring to FIG. 1, the novel memory comprises a memory cell array 2 having two hundred fifty-six memory cells 4 disposed in a matrix of sixteen rows by sixteen columns. Individual memory cells are designated by addresses comprising eight bits $A_7$ to $A_0$, the high address bits $A_7$ to $A_4$ being the row address and the low address bits $A_3$ to $A_0$ being the column address. Addresses are provided from an external device such as a central processing unit. The low address bits $A_3$ to $A_0$ are supplied to a column address decoder 6. The high address bits $A_7$ to $A_4$ are supplied to a row address decoder 8.

The column address decoder 6 has an enable input terminal designated E in FIG. 1, and sixteen output terminals designated $XO_0$ to $XO_{15}$. When the enable input at E is high, the column address decoder 6 decodes the four low address bits, selects one of the sixteen output terminals as designated by the low address bits, and outputs a high column select signal at the selected output terminal. When the enable input at E is low, the column address decoder 6 outputs low column select signals at all sixteen output terminals $XO_0$ to $XO_{15}$.

The row address decoder 8 is similarly structured with an enable input terminal E and sixteen output terminals $YO_0$ to $YO_{15}$, one of which is selected by decoding the four high address bits $A_7$ to $A_4$ when the enable input is high.

The enable input terminal E of the column address decoder 6 is connected to the output of a NOR gate 10, the two inputs of which are a first group select signal SELX0 and a second group select signal SELX1. SELX0 and SELX1 are provided from an external device such as test equipment or a reset circuit. The sixteen output terminals $XO_0$ to $XO_{15}$ of the column address decoder 6 are connected to respective input terminals of sixteen two-input OR gates 12-0 to 12-15. SELX0 is provided as the other input to the even-numbered OR gates 12-0, 12-2, ..., 12-14. SELX1 is provided as the other input to the odd-numbered OR gates 12-1, 12-3, ..., 12-15.

Similarly, the enable input terminal E of the row address decoder 8 is connected to the output of a NOR gate 14 that receives a third group select signal SELY0 and a fourth group select signal SELY1. The sixteen output terminals $YO_0$ to $YO_{15}$ are connected to input terminals of sixteen two-input OR gates 16-0 to 16-15. SELY0 is provided as the other input to the even-numbered OR gates 16-0, 16-2, ..., 16-14, and SELY1 as the other input to the odd-numbered OR gates 16-1, 16-3, ..., 16-15.

The outputs of the two-input OR gates 12-0 to 12-15 select columns of memory cells 4 in the memory cell array 2. The outputs of the two-input OR gates 16-0 to 16-15 select rows of memory cells 4 in the memory cell array 2. A specific memory cell 4 can be written or read when its row and column are selected.

The even-numbered OR gates 12-0, 12-2, ..., 12-14 form the first plurality of logic gates referred to in the summary of the invention. The odd-numbered OR gates 12-1, 12-3, ..., 12-15 form the second plurality of logic gates. The even numbered OR gates 16-0, 16-2, ..., 16-14 form the third plurality of logic gates. The odd numbered OR gates 16-1, 16-3, ..., 16-15 form the fourth plurality of logic gates.

When a memory cell 4 is written or read, one bit of data is transferred between that memory cell 4 and an external divice via a data signal line designated DA in FIG. 1. Reading and writing are performed in response to signals designated RE (read enable) and WE (write enable). Details of the circuits associated with these signals will be omitted since they are well known.

The operation of the novel memory will be described for three cases: normal reading or writing of a single memory cell; writing to multiple memory cells simultaneously; and testing and initialization.

In normal reading or writing SELX0, SELX1, SELY0, and SELY1 are all inactive (low). The enable signals output from the NOR gate 10 and the NOR gate 14 are accordingly both high. Address bits are input to the row address decoder 8 and the column address decoder 6. The column address decoder 6 decoder the column address bits $A_3$ to $A_0$ and outputs a high select signal at one of the sixteen output terminals $XO_0$ to $XO_{15}$. This high signal passes through one of the two-input OR gates 12-0 to 12-15 to the memory cell array 2 where it selects a column in the memory cell array 2. Similarly, the row address decoder 8 decodes the row address bits $A_7$ to $A_4$ and outputs a high select signal at one of the sixteen output terminals $YO_0$ to $YO_{15}$. This high signal passes through one of the two-input OR gates 16-0 to 16-15 and selects a row in the memory cell array 2.

For a write operation, the write enable signal WE is active. The single memory cell 4 at the intersection of the selected row and selected column receives a bit of data via the DA signal line and stores the value of this bit. For a read operation the read enable signal RE is active, and the bit stored in the selected memory cell 4 is output on the DA signal line.

Writing to multiple memory cells simultaneously takes place when one or more of the signals SELX0, SELX1, SELY0, and SELY1 is active (high). Four examples will be given, using the letters H and L to represent high and low.

EXAMPLE 1: SELX0=H, SELX1=L, SELY0=H, SELY1=L

Since SELX0 and SELY0 are high, the enable signals output from the NOR gate 10 and the NOR gate 14 are both low, so no select signals are output from the column address decoder 6 and the row address decoder 8. The outputs of the even-numbered OR gates 12-0, 12-2, ..., 12-14 and the even-numbered OR gates 16-0, 16-2, ..., 16-14 are high, however, so the bit on the DA signal line is written simultaneously to all sixty-four memory cells 4 that have even row and column addresses. For example, if DA="1," the value of "1" is written in these memory cells.

EXAMPLE 2: SELX0=L, SELX1=H, SELY0=H, SELY1=L

The outputs of the odd-numbered OR gates 12-1, 12-3, ..., 12-15 and the even-numbered OR gates 16-0, 16-2, ..., 16-14 go high, so the DA value is written simultaneously to the sixty-four memory cells 4 that have even row addresses and odd column addresses. For example, if DA="0," the value "0" is written in these memory cells.

EXAMPLE 3: SELX0=H, SELX1=L, SELY0=H, SELY1=H

The outputs of the even-numbered OR gates 12-0, 12-2, ..., 12-14 and of all the OR gates 16-0, 16-1, ..., 16-15 go high, so the DA value is written simultaneously to the one hundred twenty-eight memory cells 4 that have even column addresses.

EXAMPLE 4: SELX0=H, SELX1=H, SELY0=H, SELY1=H

The outputs of all the OR gates 12-0, 12-1, ..., 12-15 and 16-0, 16-1, ..., 16-15 go high, so the DA value is written simultaneously to all two hundred fifty-six memory cells 4.

Testing and initialization will be described with reference to FIGS. 2 to 6, which show various patterns of data written in the memory cell array 2. Hatched squares represent memory cells containing the value "1" and white squares represent memory cells containing the value "0."

Figure 3:
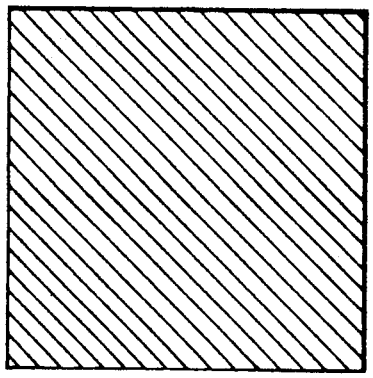
FIG. 3 illustrates an all-one test pattern.
Figure 2:
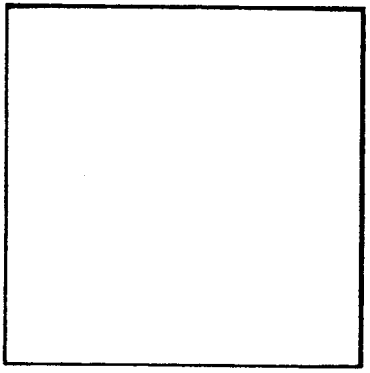
FIG. 2 illustrates an all-zero test pattern.

The memory is generally initializad by clearing all memory cells to "0" as in FIG. 2, or by writing "1" in all memory cells as in FIG. 3. Such initialization can be performed in a single multiple-bit write operation in which SELX0, SELX1, SELY0, and SELY1 are all high, as in example 4 above. Initialization is thus completed nearly instantaneously, which is a great convenience to the user. The memory can be initialized automatically, without using software, by having a system reset signal drive SELX0, SELX1, SELY0, and SELY1 to the high state and DA to the desired initial value.

The memory is tested by writing patterns of data such as the patterns in FIGS. 2 to 6 in the memory cell array 2, then reading all the memory cells 4 one by one and verifying that correct data are obtained. To test the memory thoroughly this procedure is carried out several times using different patterns.

By using the group select signals SELX0, SELX1, SELY0, and SELY1, test patterns like those in FIGS. 2 to 6 can be written very quickly. The all-zero and all-one patterns in FIGS. 2 and 3 can be written in a single operation as already noted. The pattern in FIG. 4 can be written in two operations, as follows:

(1) SELX0=H, SELX1=L, SELY0=H, SELY1=H, DA=1 (writing "1" in even-numbered columns)

(2) SELX0=L, SELX1=H, SELY0=H, SELY1=H, DA=0 (writing "0" in odd-numbered columns)

Figure 5:
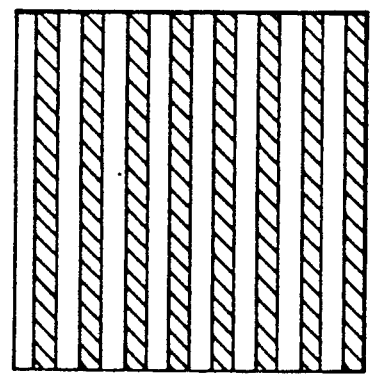
FIG. 5 illustrates a horizontal-stripe test pattern.

Similarly, the pattern in FIG. 5 can be written in two operations.

Figure 6:
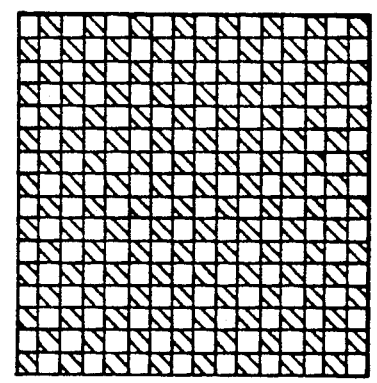
FIG. 6 illustrates a checkerboard test pattern.

The pattern in FIG. 6 can be written in four operations as follows:

(1) SELX0=H, SELX1=L, SELY0=H, SELY1=L, DA=1

(2) SELX0=L, SELX1=H, SELY0=H, SELY1=L, DA=0

(3) SELX0=L, SELX1=H, SELY0=L, SELY1=H, DA=1

(4) SELX0=H, SELX1=L, SELY0=L, SELY1=H, DA=0

The time needed for writing a test pattern is accordingly greatly shortened as compared with the prior art, in which each bit had to be written individually. This is a convenience to the manufacturer, and enables the memory to be tested at a lower cost than in the past.

The invention can be applied to memories of any storage capacity, using the same scheme as in FIG. 1 to select all even- or odd-numbered rows or columns simultaneously.

The invention can be applied without change to memories having multiple-bit words, in which multiple memory cells are disposed at each row-column intersection, and multiple bits are written or read simultaneously via multiple data lines.

The invention can be applied to dynamic random access memory (DRAM), in which row and column addresses are input separately. (In addition to the circuits shown in FIG. 1, a DRAM has additional well-known circuits such as an address multiplexer, refresh circuit, and sense amplifiers.)

Depending on signal polarity, the logic gates in FIG. 1 can be replaced with other types of gates. For example, if SELX0, SELX1, SELY0, SELY1, XO0, ..., XO15, and YO0, ..., YO15 are active low, the two-input OR gates 12-0 to 12-15 and 16-0 to 16-15 and the NOR gates 43 and 45 should be replaced by AND gates.

The enable input signals to the column address decoder 6 and the row address decoder 8 need not be generated from SELX0, SELX1, SELY0, and SELY1 as in FIG. 1. Enable signals can be supplied independently of SELX0, SELX1, SELY0, and SELY1, making it possible to place the memory in a state in which no rows or columns are selected.

Those skilled in the art will doubtlessly find other modifications that can be made without departing from the spirit and scope of the invention, which should be ascertained solely from the appended claims.

What is claimed is:

1. A random access memory, comprising:
   a memory cell array having memory cells disposed in a matrix of consecutively numbered rows and consecutively numbered columns;
   a row decoding circuit, having an output terminal for each of said rows, for decoding a row address and producing an active row select signal at the output terminal of the row corresponding to the row address;
   a column decoding circuit, having an output terminal for each of said columns, for decoding a column address and producing an active column select signal at the output terminal of the column corresponding to the column address;
   a first plurality of logic gates, coupled to said column decoding circuit, for gating the column select signal of each even-numbered column with a first group select signal and selecting a column in said memory cell array when either the column select signal of that column of the first group select signal is active;
   a second plurality of logic gates, coupled to said column decoding circuit, for gating the column select signal of each odd-numbered column with a second group select signal and selecting a column in said memory cell array when either the column select signal of that column or the second group select signal is active;
   a third plurality of logic gates, coupled to said row decoding circuit, for gating the row select signal of each even-numbered row with a third group select signal and selecting a row in said memory cell array when either the row select signal of that row or the third group select signal is active; and
   a fourth plurality of logic gates, coupled to said row decoding circuit, for gating the row select signal of each odd-numbered row with a fourth group select signal and selecting a row in said memory cell array when either the row select signal of that row or the fourth group select signal is active,
   wherein said first group select signal, said second group select signal, said third group select signal, and said fourth group select signal are driven active by a reset signal.

2. The memory of claim 1, wherein said first plurality of logic gates, said second plurality of logic gates, said third plurality of logic gates, and said fourth plurality of logic gates comprise OR gates.

3. The memory of claim 1, wherein said column decoding circuit is responsive to an enable input signal for enabling signal output.

4. The memory of claim 3, also comprising a logic gate for making said enable input signal inactive when either the first group select signal or the second group select signal is active.

5. The memory of claim 4, wherein said logic gate is a NOR gate.

6. The memory of claim 1, wherein said row decoding circuit is responsive to an enable input signal for enabling signal output.

7. The memory of claim 6, also comprising a logic gate for making said enable input signal inactive when either the third group select signal or the fourth group select signal is active.

8. The memory of claim 7, wherein said logic gate is a NOR gate.

9. A random access memory, comprising:
   a memory cell array having memory cells disposed in a matrix of consecutively numbered rows and consecutively numbered columns;
   a row decoding circuit, having an output terminal for each of said rows, for decoding a row address and producing an active row select signal at the output terminal of the row corresponding to the row address;
   a column decoding circuit, having an output terminal for each of said column, for decoding a column address and producing an active column select signal at the output terminal of the column corresponding to the column address, said column decoding means being responsive to an enable input signal for enabling signal output;
   a first plurality of logic gates, coupled to said column decoding circuit, for gating the column select signal of each even-numbered column with a first group select signal and selecting a column in said memory cell array when either the column select signal of that column or the first group select signal is active;
   a second plurality of logic gates, coupled to said column decoding circuit, for gating the column select signal of each odd-numbered column with a second group select signal and selecting a column in said memory cell array when either the column select signal of that column or the second group select signal is active;
   a third plurality of logic gates, coupled to said row decoding circuit, for gating the row select signal of each even-numbered row with a third group select signal and selecting a row in said memory cell array when either the row select signal of that row or the third group select signal is active;
   a fourth plurality of logic gates, coupled to said row decoding circuit, for gating the row select signal of each odd-numbered row with a fourth group select signal and selecting a row in said memory cell array when either the row select signal of that row or the fourth group select signal is active; and
   a logic gate for making said enable input signal to said column decoding circuit inactive when either the first group select signal or the second group select signal is active.

10. The memory of claim 9, wherein said logic gate is a NOR gate.

11. The memory of claim 7, wherein said row decoding circuit is responsive to an enable input signal for enabling signal output.

12. The memory of claim 11, also comprising a logic gate for making said enable input signal to said row decoding circuit inactive when either the third group select signal or the fourth group select signal is active.

13. The memory of claim 12, wherein said logic gate for making said enable input signal to said row decoding circuit inactive is a NOR gate.

14. A random access memory, comprising:
a memory cell array having memory cells disposed in a matrix of consecutively numbered rows and consecutively numbered columns;
a row decoding circuit, having an output terminal for each of said rows, for decoding a row address and producing an active row select signal at the output terminal of the row corresponding to the row address, said row decoding circuit being responsive to an enable input signal for enabling signal output;
a column decoding circuit, having an output terminal for each of said columns, for decoding a column address and producing an active column select signal at the output terminal of the column corresponding to the column address;
a first plurality of logic gates, coupled to said column decoding circuit, for gating the column select signal of each even-numbered column with a first group select signal and selecting a column in said memory cell array when either the column select signal of that column or the first group select signal is active;
a second plurality of logic gates, coupled to said column decoding circuit, for gating the column select signal of each odd-numbered column with a second group select signal and selecting a column in said memory cell array when either the column select signal of that column or the second group select signal is active;
a third plurality of logic gates, coupled to said row decoding circuit, for gating the row select signal of each even-numbered row with a third group select signal and selecting a row in said memory cell array when either the row select signal of that row or the third group select signal is active;
a fourth plurality of logic gates, coupled to said row decoding circuit, for gating the row select signal of each odd-numbered row with a fourth group select signal and selecting a row in said memory cell array when either the row select signal of that row or the fourth group select signal is active; and
a logic gate for making said enable input signal to said row decoding circuit inactive when either the third group select signal or the fourth group select signal is active.

15. The memory of claim 14, wherein said logic gate is a NOR gate.

16. The memory of claim 14, wherein said column decoding circuit is responsive to an enable input signal for enabling signal output.

17. The memory of claim 16, also comprising a NOR gate for making said enable input signal to said column decoding circuit inactive when either the first group select signal or the second group select signal is active.

18. A random access memory, comprising:
a memory cell array having memory cells disposed in a matrix of consecutively numbered rows and consecutively numbered columns;
a row decoding circuit, having an output terminal for each of said rows, for decoding a row address and producing an active row select signal at the output terminal of the row corresponding to the row address;
a column decoding circuit, having an output terminal for each of said columns, for decoding a column address and producing an active column select signal at the output terminal of the column corresponding to the column address, said column decoding circuit being responsive to an enable input signal for enabling signal output;
a first plurality of logic gates, coupled to said column decoding circuit, for gating the column select signal of each even-numbered column with a first group select signal and selecting a column in said memory cell array when either the column select signal of that column or the first group select signal is active;
a second plurality of logic gates, coupled to said column decoding circuit, for gating the column select signal of each odd-numbered column with a second group select signal and selecting a column in said memory cell array when either the column select signal of that column or the second group select signal is active; and
a logic gate for making said enable input signal inactive when either the first group select signal or the second group select signal is active.

19. A random access memory, comprising:
a memory cell array having memory cells disposed in a matrix of consecutively numbered rows and consecutively numbered columns;
a row decoding circuit, having an output terminal for each of said rows, for decoding a row address and producing an active row select signal at the output terminal of the row corresponding to the row address, said row decoding circuit being responsive to an enable input signal for enabling signal output;
a column decoding circuit, having an output terminal for each of said columns, for decoding a column address and producing an active column select signal at the output terminal of the column corresponding to the column address;
a plurality of logic gates, coupled to said row decoding circuit, for gating the row select signal of each even-numbered row with a group select signal and selecting a row in said memory cell array when either the row select signal of that row or the group select signal is active;
another plurality of logic gates, coupled to said row decoding circuit, for gating the row select signal of each odd-numbered row with another group select signal and selecting a row in said memory cell array when either the row select signal of that row or the another group select signal is active; and
a logic gate for making said enable input signal inactive when either group select signal is active.

20. A random access memory, comprising:
a memory cell array having memory cells disposed in a matrix of rows and columns;
an addressing circuit, having row output terminals corresponding to the rows of the memory cell array and column output terminals corresponding to the columns of the memory cell array, for receiving address information which specifies a row and a column of the memory cell array and for producing an active row select signal at the row output terminal for the row specified by the address information and an active column select signal at the column output terminal for the column specified by the address information;

a first circuit, including a plurality of first logic gates connected between a first group of the column output terminals and the corresponding columns of the memory cell array, for gating the column select signals at the first group of column output terminals with a first group select signal so as to select all columns of the memory cell array that correspond to the first group of column output terminals if the first group select signal is active or to select one of the columns of the memory cell array that correspond to the first group of column output terminals if the column select signal for that column is active;

a second circuit, including a plurality of second logic gates connected between a second group of the column output terminals and the corresponding columns of the memory cell array, for gating the column select signals at the second group of column output terminals with a second group select signal so as to select all columns of the memory cell array that correspond to the second group of column output terminals if the second group select signal is active or to select one of the columns of the memory cell array that correspond to the second group of column output terminals if the column select signal for that column is active;

a third circuit, including a plurality of third logic gates connected between a first group of the row output terminals and the corresponding rows of the memory cell array, for gating the row select signals at the first group of row output terminals with a third group select signal so as to select all rows of the memory cell array that correspond to the first group of row output terminals if the third group select signal is active or to select one of the rows of the memory cell array that correspond to the first group of row output terminals if the row select signal for that row is active; and a fourth circuit, including a plurality of fourth logic gates connected between a second group of the row output terminals and the corresponding rows of the memory cell array, for gating the row select signals at the second group of row output terminals with a fourth group select signal so as to select all rows of the memory cell array that correspond to the second group of row output terminals if the fourth group select signal is active or to select one of the rows of the memory cell array that correspond to the second group of row output terminals if the row select signal for that row is active.

21. The memory of claim 20, further comprising a circuit for preventing the addressing circuit from producing an active column select signal if either of the first and second group select signals is active.

22. The memory of claim 21, wherein the addressing circuit comprises a column address decoder which provides the column output terminals, the column address decoder having an enable input terminal, and wherein the circuit for preventing comprises a logic gate having an input terminal which receives the first group select signal, another input terminal which receives the second group select signal, and an output terminal which is connected to the enable input terminal of the column address decoder.

23. The memory of claim 21, further comprising a circuit for preventing the addressing circuit from producing an active row select signal if either of the third and fourth group select signals is active.

24. The memory of claim 20, wherein each of the column output terminals of the addressing circuit is a member of either the first group or the second group.

25. The memory of claim 24, wherein the number of column output terminals in the first group is approximately the same as the number of column output terminals in the second group.

26. The memory of claim 25, wherein the memory cell array has even-numbered columns and odd-numbered columns, and wherein the column output terminals in the first group correspond to the even-numbered columns and the column output terminals in the second group correspond to the odd-numbered columns.

27. The memory of claim 24, wherein each of the row output terminals of the addressing circuit is a member of either the third group or the fourth group.

* * * * *

UNITED STATES PATENT AND TRADEMARK OFFICE
CERTIFICATE OF CORRECTION

PATENT NO. : 5,267,212
DATED : November 30, 1993
INVENTOR(S) : Sumihiro TAKASHIMA It is certified that error appears in the above-indentified patent and that said Letters Patent is hereby corrected as shown below:

On title page, item

-- [75] Inventor: Sumihiro TAKASHIMA, Tokyo, Japan --

-- [30] Foreign Application Priority Data
    Oct. 23, 1990 [JP] Japan ....... 2-284578 --

Signed and Sealed this

Twenty-ninth Day of November, 1994

Attest:

BRUCE LEHMAN

*Attesting Officer*       *Commissioner of Patents and Trademarks*